(12) United States Patent
Hong et al.

(10) Patent No.: US 10,937,740 B2
(45) Date of Patent: Mar. 2, 2021

(54) COMPOSITIONS FOR GAP COATING AND/OR FILLING IN OR BETWEEN ELECTRONIC PACKAGES BY CAPILLARY FLOW AND METHODS FOR THE USE THEREOF

(71) Applicant: HENKEL IP & HOLDING GMBH, Duesseldorf (DE)

(72) Inventors: Xuan Hong, Irvine, CA (US); Xinpei Cao, Irvine, CA (US); Derek Wyatt, Mission Viejo, CA (US); Qizhuo Zhuo, Irvine, CA (US); Elizabeth Hoang, Orange, CA (US)

(73) Assignee: HENKEL IP & HOLDING GMBH, Duesseldorf (DE)

( * ) Notice: Subject to any disclaimer, the term of this patent is extended or adjusted under 35 U.S.C. 154(b) by 14 days.

(21) Appl. No.: 16/188,492

(22) Filed: Nov. 13, 2018

(65) Prior Publication Data
US 2019/0096822 A1 Mar. 28, 2019

Related U.S. Application Data

(63) Continuation of application No. PCT/US2017/034388, filed on May 25, 2017.
(Continued)

(51) Int. Cl.
*H01L 23/552* (2006.01)
*H01L 21/3205* (2006.01)
(Continued)

(52) U.S. Cl.
CPC .............. *H01L 23/552* (2013.01); *C09D 5/24* (2013.01); *C09D 5/32* (2013.01); *C09D 7/67* (2018.01);
(Continued)

(58) Field of Classification Search
None
See application file for complete search history.

(56) References Cited

U.S. PATENT DOCUMENTS

| 5,717,034 A | 2/1998 | Dersehm et al. |
| 5,718,941 A | 2/1998 | Dersehm et al. |

(Continued)

FOREIGN PATENT DOCUMENTS

| CN | 101878509 A | 11/2010 |
| CN | 102076801 A | 5/2011 |

(Continued)

OTHER PUBLICATIONS

Khimicheskaya Entsiklopedia. Tom 4, Nauchnoe izdatelstvo "Bolshaya Rossijskaya entsiklopedia", Moskva, 1995, col. 358-360.
(Continued)

*Primary Examiner* — Joseph D Anthony
(74) *Attorney, Agent, or Firm* — Steven C. Bauman

(57) ABSTRACT

Provided herein are conductive formulations which are useful for applying conductive material to a suitable substrate; the resulting coated articles have improved EMI shielding performance relative to articles coated with prior art formulations employing prior art methods. In accordance with certain aspects of the present invention, there are also provided methods for filling a gap in an electronic package to achieve electromagnetic interference (EMI) shielding thereof, as well as the resulting articles shielded thereby. Specifically, invention methods utilize capillary flow to substantially fill any gaps in the coating on the surface of an electronic package. Effective EMI shielding has been demonstrated with very thin coating thickness.

20 Claims, 1 Drawing Sheet

Related U.S. Application Data

(60) Provisional application No. 62/342,450, filed on May 27, 2016.

(51) Int. Cl.
    *H01L 21/56*     (2006.01)
    *H01B 1/22*     (2006.01)
    *C09D 163/00*     (2006.01)
    *C09D 5/24*     (2006.01)
    *C09D 5/32*     (2006.01)
    *C09D 7/40*     (2018.01)

(52) U.S. Cl.
    CPC ............. *C09D 7/68* (2018.01); *C09D 7/69* (2018.01); *C09D 163/00* (2013.01); *H01B 1/22* (2013.01); *H01L 21/32056* (2013.01); *H01L 21/56* (2013.01); *C08L 2203/20* (2013.01); *C08L 2205/025* (2013.01); *C08L 2205/03* (2013.01)

(56) References Cited

U.S. PATENT DOCUMENTS

| | | | |
|---|---|---|---|
| 5,855,821 A | 1/1999 | Chau et al. | |
| 6,057,381 A | 5/2000 | Ma et al. | |
| 8,769,811 B2 | 7/2014 | Wurzel et al. | |
| 8,975,004 B2 | 3/2015 | Choi et al. | |
| 10,287,444 B2* | 5/2019 | Fang | C09D 5/32 |
| 2004/0086719 A1 | 5/2004 | Chan et al. | |
| 2010/0076120 A1* | 3/2010 | Emmerson | C08J 3/203 |
| | | | 524/1 |
| 2011/0049439 A1 | 3/2011 | Higuchi et al. | |
| 2011/0095241 A1 | 4/2011 | Kong et al. | |
| 2017/0037261 A1* | 2/2017 | Fang | C09D 163/00 |
| 2018/0249603 A1* | 8/2018 | Huang | H01L 23/552 |
| 2020/0307803 A1* | 10/2020 | Donnig | B64D 11/0624 |

FOREIGN PATENT DOCUMENTS

| | | |
|---|---|---|
| WO | 2006023860 A2 | 3/2006 |
| WO | 2008066995 A2 | 6/2008 |
| WO | 2015157987 A1 | 10/2015 |
| WO | 2017027482 A1 | 2/2017 |
| WO | 2017070843 A1 | 5/2017 |

OTHER PUBLICATIONS

Rogers-Evans, M. et al., "Oxetanes as Versatile Elements in Drug Discovery and Synthesis." in Angew. Chem. Int. 2010, 49, pp. 9052-9067.

* cited by examiner

COMPOSITIONS FOR GAP COATING AND/OR FILLING IN OR BETWEEN ELECTRONIC PACKAGES BY CAPILLARY FLOW AND METHODS FOR THE USE THEREOF

FIELD OF THE INVENTION

The present invention relates to methods for filling gaps in, and providing EMI (electromagnetic interference) shielding to, electronic packages. The present invention also relates to compositions useful in such methods. In another aspect, the present invention also relates to articles prepared using invention formulations and methods.

BACKGROUND OF THE INVENTION

EMI shielding is the practice of reducing the electromagnetic field in a space by blocking the field with barriers made of conductive or magnetic materials. Shielding is typically applied to enclosures to isolate electrical devices from the 'outside world'. Electromagnetic shielding that blocks radio frequency electromagnetic radiation is also known as RF shielding.

EMI shielding can reduce the coupling of radio waves, electromagnetic fields and electrostatic fields. A conductive enclosure used to block electrostatic fields is also known as a Faraday cage. The amount of reduction one can achieve depends upon such factors as the material used, its thickness, the conductivity of the coatings, the frequency of the fields of interest, and the like.

Plating methods can provide full coverage on electronic packages and potentially have good thickness control. Such methods have very good unit per hour productivity (UPH) and relatively low material cost. However, these methods require pre-treatment of the surface to be coated and require laborious masking of the substrate.

Sputter methods are well-known and widely accepted processes for EMI shielding applications. Such methods typically incur low material costs, yet are able to provide very effective EMI shielding due to the high electrical conductivity of the coating. However, such methods require the use of very expensive equipment; moreover, its UPH is very low.

Conductive paste adhesives have also been used for EMI shielding protection. Unfortunately, however, when the paste adhesive doesn't have high electrical conductivity, very thick films are needed in order to achieve the desired shielding performance.

Conductive coatings provide EMI protection to electronic packages with a conductive composition, which consists of a carrier material including thermoset and thermoplastic, loaded with a suitable metal, typically silver, copper, nickel, or the like, in the form of very small particulates. The coating is usually applied by a spray or printing process on the electronic package and once dry, produces a continuous conductive layer, which can be electrically connected to the chassis ground of the equipment, thus providing effective shielding. A limitation of this method is that the EMI shielding effectiveness is not as good as pure metal sheet or metal coatings provided by plating and sputtering (due to the inferior electrical conductivity of the conductive coatings). Another limitation is that it is difficult to produce a uniform, three-dimensional thin coating on an electronic package by regular spray or printing processes.

These and other limitations of prior art methods are hereby addressed by the present invention.

SUMMARY OF THE INVENTION

In accordance with the present invention, there are provided conductive formulations which are useful for applying conductive material to a suitable substrate; the resulting coated articles have improved EMI shielding performance relative to articles coated with prior art formulations employing prior art methods.

In accordance with certain aspects of the present invention, there are also provided methods for filling a gap in an electronic package to achieve electromagnetic interference (EMI) shielding thereof, as well as the resulting articles shielded thereby. Specifically, invention methods utilize capillary flow to substantially fill any gaps in the coating on the surface of an electronic package. Effective EMI shielding has been demonstrated with very thin coating thickness.

In accordance with the present invention, the limitations of the prior art have been overcome and the excellent performance of invention compositions, and methods for preparing and using same, have been demonstrated as follows:

High conductivity compositions according to the invention improve the EMI shielding performance thereof; effective EMI shielding performance is achieved at a coating thickness as low as 5 µm, and a gap thickness of less than about 250 µm (and as low as about 5 µm).

Much higher UPH is obtained with invention formulations, relative to that obtained with sputter coatings; moreover, invention methods provide similar metal coatings compared with coatings prepared by sputter and plate processes.

In certain aspects of the present invention, there are also provided articles prepared using invention formulations and methods.

DETAILED DESCRIPTION OF THE INVENTION

Figure 1A:
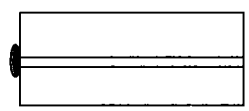
FIGS. 1A-1C illustrate an embodiment of the present invention wherein a conductive formulation according to the present invention is applied at the open edge of an article having a gap under conditions suitable for capillary flow of said formulation so as to substantially fill the gap.

In accordance with the present invention, there are provided conductive formulations comprising:
an organic matrix comprising a thermoset resin and curing agent therefor, and/or a thermoplastic resin and optional curing agent therefor,
a conductive filler, and
optionally a diluent;
wherein said conductive formulation has:
a viscosity in the range of about 1 up to about 20,000 centipoise at the operating temperature, a thixotropic index (TI) in the range of about 0.01 up to about 5 (in some embodiments, the TI falls in the range of about 0.1-3) at the operating temperature, and a volume resistance and/or magnetic resistance effective for electromagnetic interference (EMI) shielding.

Invention formulations are further defined as having an electrical volume resistivity in the range of about $10^{-6}$ up to about $10^3$ ohm-cm and/or an EMI shielding effectiveness of 1-200 dB; in some embodiments, the EMI shielding effectiveness is 1-180; in some embodiments, the EMI shielding effectiveness is 1-160; in some embodiments, the EMI shielding effectiveness is 1-140; in some embodiments, the EMI shielding effectiveness is 1-120; in some embodiments, the EMI shielding effectiveness is 1-100 dB.

EMI shielding contemplated herein is effective over a wide range of frequencies, e.g., 10 Hz-10 GigaHertz; in some embodiments, EMI shielding is effective over a frequency in the range of about $10^3$ Hz-200 megahertz.

The EMI effectiveness can be measured in a variety of ways, e.g., employing a waveguide system (1.7-2.8 GHz) which includes two waveguide-to-coaxial adapters and a vector network analyzer. The sample is prepared as a thin film layer with the target thickness coated on a PET film. The sample size is 5×3". The material is suitable for application with >14 KHz frequency and gives better performance at >1 GHz.

Organic Matrices

A wide variety of organic matrices are contemplated for use herein; exemplary organic matrices include thermoset resins and/or thermoplastic resins.

In some embodiments, the resin contemplated for use in invention formulations is a thermoset.

When invention formulations comprise a thermoset, the formulation typically comprises:

in the range of about 0.1 wt % up to about 90 wt % of said thermoset resin, based on the total weight of said formulation, in the range of about 10 wt % up to about 95 wt % of said conductive filler, based on the total weight of said formulation, in the range of about 0.01 wt % up to about 1 wt % of said curing agent, based on the total weight of said formulation, and in the range of 0 up to about 89.8 wt % of said optional diluent, based on the total weight of said formulation.

In some embodiments, the resin contemplated for use in invention formulations is a thermoplastic.

When invention formulations comprise a thermoplastic, the formulation typically comprises:

in the range of about 0.5 wt % up to about 90 wt % of said thermoplastic resin, based on the total weight of said formulation, in the range of about 10 wt % up to about 95 wt % of said conductive filler, based on the total weight of said formulation, and in the range of 0 up to about 89.5 wt % of said optional diluent, based on the total weight of said formulation.

In some embodiments, the resin contemplated for use in invention formulations is a combination of a thermoset and a thermoplastic.

When invention formulations comprise a combination of a thermoset and a thermoplastic, the formulation typically comprises:

in the range of about 0.1 wt % up to about 80 wt % of said thermoset resin, based on the total weight of said formulation, in the range of about 0.1 wt % up to about 80 wt % of said thermoplastic resin, based on the total weight of said formulation, in the range of about 10 wt % up to about 95 wt % of said conductive filler, based on the total weight of said formulation, and in the range of 0 up to about 89.5 wt % of said optional diluent, based on the total weight of said formulation.

Exemplary thermosets contemplated for use herein include epoxies, acrylics, acrylates, acrylate esters, vinyl resins, maleimides, nadimides, itaconimides, cyanate esters, alkyd resins, cyanate esters, phenolics, benzoxazines, polyimides, functionalized polyimides, oxetanes, vinyl ethers, polyurethanes, melamines, urea-formaldehyde resins, phenol-formaldehyde resins, silicones, melamines, and the like, as well as mixtures of any two or more thereof.

Exemplary curing agents contemplated for use herein with said thermoset include ureas, aliphatic amines, aromatic amines, amine hardeners, polyamides, imidazoles, dicyandiamides, hydrazides, urea-amine hybrid curing systems, free radical initiators (e.g., peroxy esters, peroxy carbonates, hydroperoxides, alkylperoxides, arylperoxides, azo compounds, and the like), organic bases, transition metal catalysts, phenols, acid anhydrides, Lewis acids, Lewis bases, and the like, as well as mixtures of any two or more thereof.

Epoxies

A wide variety of epoxy-functionalized resins are contemplated for use herein, e.g., liquid-type epoxy resins based on bisphenol A, solid-type epoxy resins based on bisphenol A, liquid-type epoxy resins based on bisphenol F (e.g., Epiclon EXA-835LV), multifunctional epoxy resins based on phenol-novolac resin, dicyclopentadiene-type epoxy resins (e.g., Epiclon HP-7200L), naphthalene-type epoxy resins, and the like, as well as mixtures of any two or more thereof.

Exemplary epoxy-functionalized resins contemplated for use herein include the diepoxide of the cycloaliphatic alcohol, hydrogenated bisphenol A (commercially available as Epalloy 5000), a difunctional cycloaliphatic glycidyl ester of hexahydrophthallic anhydride (commercially available as Epalloy 5200), Epiclon EXA-835LV, Epiclon HP-7200L, and the like, as well as mixtures of any two or more thereof.

In certain embodiments, the epoxy component may include the combination of two or more different bisphenol based epoxies. These bisphenol based epoxies may be selected from bisphenol A, bisphenol F, or bisphenol S epoxies, or combinations thereof. In addition, two or more different bisphenol epoxies within the same type of resin (such A, F or S) may be used.

Commercially available examples of the bisphenol epoxies contemplated for use herein include bisphenol-F-type epoxies (such as RE-404-S from Nippon Kayaku, Japan, and EPICLON 830 (RE1801), 830S (RE1815), 830A (RE1826) and 830W from Dai Nippon Ink & Chemicals, Inc., and RSL 1738 and YL-983U from Resolution) and bisphenol-A-type epoxies (such as YL-979 and 980 from Resolution).

The bisphenol epoxies available commercially from Dai Nippon and noted above are promoted as liquid undiluted epichlorohydrin-bisphenol F epoxies having much lower viscosities than conventional epoxies based on bisphenol A epoxies and have physical properties similar to liquid bisphenol A epoxies. Bisphenol F epoxy has lower viscosity than bisphenol A epoxies, all else being the same between the two types of epoxies, which affords a lower viscosity and thus a fast flow underfill sealant material. The EEW of these four bisphenol F epoxies is between 165 and 180. The viscosity at 25° C. is between 3,000 and 4,500 cps (except for RE1801 whose upper viscosity limit is 4,000 cps). The hydrolyzable chloride content is reported as 200 ppm for RE1815 and 830W, and that for RE1826 as 100 ppm.

The bisphenol epoxies available commercially from Resolution and noted above are promoted as low chloride containing liquid epoxies. The bisphenol A epoxies have a EEW (g/eq) of between 180 and 195 and a viscosity at 25° C. of between 100 and 250 cps. The total chloride content for YL-979 is reported as between 500 and 700 ppm, and that for YL-980 as between 100 and 300 ppm. The bisphenol F epoxies have a EEW (g/eq) of between 165 and 180 and a viscosity at 25° C. of between 30 and 60. The total chloride content for RSL-1738 is reported as between 500 and 700 ppm, and that for YL-983U as between 150 and 350 ppm.

In addition to the bisphenol epoxies, other epoxy compounds are contemplated for use as the epoxy component of invention formulations. For instance, cycloaliphatic epoxies, such as 3,4-epoxycyclohexylmethyl-3,4-epoxycyclohexylcarbonate, can be used. Also monofunctional, difunctional or multifunctional reactive diluents may be used to adjust the viscosity and/or lower the Tg of the resulting resin material. Exemplary reactive diluents include butyl glycidyl ether, cresyl glycidyl ether, polyethylene glycol glycidyl ether, polypropylene glycol glycidyl ether, and the like.

Epoxies suitable for use herein include polyglycidyl derivatives of phenolic compounds, such as those available commercially under the tradename EPON, such as EPON 828, EPON 1001, EPON 1009, and EPON 1031 from Resolution; DER 331, DER 332, DER 334, and DER 542 from Dow Chemical Co.; and BREN-S from Nippon Kayaku. Other suitable epoxies include polyepoxides prepared from polyols and the like and polyglycidyl derivatives of phenol-formaldehyde novolacs, the latter of such as DEN 431, DEN 438, and DEN 439 from Dow Chemical. Cresol analogs are also available commercially under the tradename ARALDITE, such as ARALDITE ECN 1235, ARALDITE ECN 1273, and ARALDITE ECN 1299 from Ciba Specialty Chemicals Corporation. SU-8 is a bisphenol-A-type epoxy novolac available from Resolution. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba Specialty Chemicals and PGA-X and PGA-C from the Sherwin-Williams Co.

Appropriate monofunctional epoxy coreactant diluents for optional use herein include those that have a viscosity which is lower than that of the epoxy component, ordinarily, less than about 250 cps.

The monofunctional epoxy coreactant diluents should have an epoxy group with an alkyl group of about 6 to about 28 carbon atoms, examples of which include $C_{6-28}$ alkyl glycidyl ethers, $C_{6-28}$ fatty acid glycidyl esters, $C_{6-28}$ alkylphenol glycidyl ethers, and the like.

In the event such a monofunctional epoxy coreactant diluent is included, such coreactant diluent should be employed in an amount from about 0.5 percent by weight to about 10 percent by weight, based on the total weight of the composition; in some embodiments, such coreactant diluent should be employed in an amount from about 0.25 percent by weight to about 5 percent by weight, based on the total weight of the composition.

The epoxy component should be present in the composition in an amount in the range of about 1 percent by weight to about 40 percent by weight; in some embodiments, invention formulations comprise about 2 percent by weight to about 18 percent by weight epoxy; in some embodiments, invention formulations comprise about 5 to about 15 percent by weight epoxy.

In some embodiments, the epoxy component employed herein is a silane modified epoxy, e.g., a composition of matter that includes:

(A) an epoxy component embraced by the following structure:

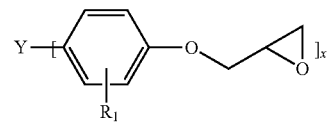

where:

Y may or may not be present and when Y present is a direct bond, $CH_2$, $CH(CH_3)_2$, $C\!=\!O$, or S, $R_1$ here is alkyl, alkenyl, hydroxy, carboxy and halogen, and x here is 1-4;

(B) an epoxy-functionalized alkoxy silane embraced by the following structure:

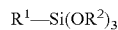

wherein $R^1$ is an oxirane-containing moiety and $R^2$ is an alkyl or alkoxy-substituted alkyl, aryl, or aralkyl group having from one to ten carbon atoms; and (C) reaction products of components (A) and (B).

An example of one such silane-modified epoxy is formed as the reaction product of an aromatic epoxy, such as a bisphenol A, E, F or S epoxy or biphenyl epoxy, and epoxy silane where the epoxy silane is embraced by the following structure:

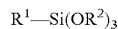

wherein $R^1$ is an oxirane-containing moiety, examples of which include 2-(ethoxymethyl)oxirane, 2-(propoxymethyl)oxirane, 2-(methoxymethyl)oxirane, and 2-(3-methoxypropyl)oxirane and $R^2$ is an alkyl or alkoxy-substituted alkyl, aryl, or aralkyl group having from one to ten carbon atoms.

In one embodiment, $R^1$ is 2-(ethoxymethyl)oxirane and $R^2$ is methyl.

Idealized structures of the aromatic epoxy used to prepare the silane modified epoxy include

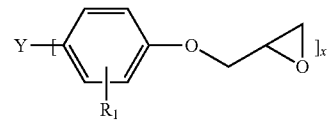

wherein

Y may or may not be present, and when Y is present, it is a direct bond, $CH_2$, $CH(CH_3)_2$, $C\!=\!O$, or S, $R_1$ is alkyl, alkenyl, hydroxy, carboxy or halogen, and x is 1-4.

Of course, when x is 2-4, chain extended versions of the aromatic epoxy are also contemplated as being embraced by this structure.

For instance, a chain extended version of the aromatic epoxy may be embraced by the structure below

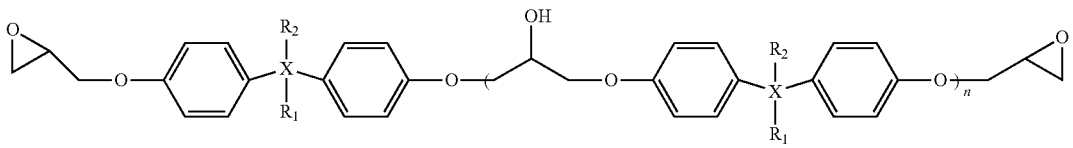

In some embodiments, the siloxane modified epoxy resin has the structure:

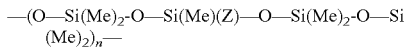

wherein:

Z is —O—(CH$_2$)$_3$—O-Ph-CH$_2$-Ph-O—(CH$_2$—CH(OH)—CH$_2$—O-Ph-CH$_2$-Ph-O—)$_n$—CH$_2$-oxirane, and n falls in the range of about 1-4.

In some embodiments, the siloxane modified epoxy resin is produced by contacting a combination of the following components under conditions suitable to promote the reaction thereof:

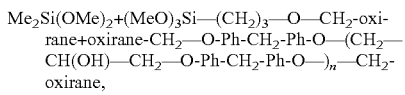

wherein "n" falls in the range of about 1-4.

The silane modified epoxy may also be a combination of the aromatic epoxy, the epoxy silane, and reaction products of the aromatic epoxy and the epoxy silane. The reaction products may be prepared from the aromatic epoxy and epoxy silane in a weight ratio of 1:100 to 100:1, such as a weight ratio of 1:10 to 10:1.

Quantities of epoxy monomer(s) contemplated for use in invention compositions are sufficient so that the resulting formulation comprises in the range of about 1-20 wt % of said epoxy. In certain embodiments, the resulting formulation comprises in the range of about 2-18 wt % of said epoxy. In certain embodiments, the resulting formulation comprises in the range of about 5-15 wt % of said epoxy.

Epoxy cure agents are optionally employed in combination with epoxy monomer(s). Exemplary epoxy cure agents include ureas, aliphatic and aromatic amines, amine hardeners, polyamides, imidazoles, dicyandiamides, hydrazides, urea-amine hybrid curing systems, free radical initiators (e.g., peroxy esters, peroxy carbonates, hydroperoxides, alkylperoxides, arylperoxides, azo compounds, and the like), organic bases, transition metal catalysts, phenols, acid anhydrides, Lewis acids, Lewis bases, and the like.

When epoxy cure agents are present, invention compositions comprise in the range of about 0.1-2 wt % thereof. In certain embodiments, invention compositions comprise in the range of about 0.5-5 wt % of epoxy cure agent.

Acrylates

Acrylates contemplated for use in the practice of the present invention are well known in the art. See, for example, U.S. Pat. No. 5,717,034, the entire contents of which are hereby incorporated by reference herein.

Exemplary acrylates contemplated for use herein include monofunctional (meth)acrylates, difunctional (meth)acrylates, trifunctional (meth)acrylates, polyfunctional (meth)acrylates, and the like.

Exemplary monofunctional (meth)acrylates include phenylphenol acrylate, methoxypolyethylene acrylate, acryloyloxyethyl succinate, fatty acid acrylate, methacryloyloxyethylphthalic acid, phenoxyethylene glycol methacrylate, fatty acid methacrylate, β-carboxyethyl acrylate, isobornyl acrylate, isobutyl acrylate, t-butyl acrylate, hydroxyethyl acrylate, hydroxypropyl acrylate, dihydrocyclopentadiethyl acrylate, cyclohexyl methacrylate, t-butyl methacrylate, dimethylaminoethyl methacrylate, diethylaminoethyl methacrylate, t-butylaminoethyl methacrylate, 4-hydroxybutyl acrylate, tetrahydrofurfuryl acrylate, benzyl acrylate, ethylcarbitol acrylate, phenoxyethyl acrylate, methoxytriethylene glycol acrylate, monopentaerythritol acrylate, dipentaerythritol acrylate, tripentaerythritol acrylate, polypentaerythritol acrylate, and the like.

Exemplary difunctional (meth)acrylates include hexanediol dimethacrylate, hydroxyacryloyloxypropyl methacrylate, hexanediol diacrylate, urethane acrylate, epoxyacrylate, bisphenol A-type epoxyacrylate, modified epoxyacrylate, fatty acid-modified epoxyacrylate, amine-modified bisphenol A-type epoxyacrylate, allyl methacrylate, ethylene glycol dimethacrylate, diethylene glycol dimethacrylate, ethoxylated bisphenol A dimethacrylate, tricyclodecanedimethanol dimethacrylate, glycerin dimethacrylate, polypropylene glycol diacrylate, propoxylated ethoxylated bisphenol A diacrylate, 9,9-bis(4-(2-acryloyloxyethoxy)phenyl)fluorene, tricyclodecane diacrylate, dipropylene glycol diacrylate, polypropylene glycol diacrylate, PO-modified neopentyl glycol diacrylate, tricyclodecanedimethanol diacrylate, 1,12-dodecanediol dimethacrylate, and the like.

Exemplary trifunctional (meth)acrylates include trimethylolpropane trimethacrylate, trimethylolpropane triacrylate, trimethylolpropane ethoxy triacrylate, polyether triacrylate, glycerin propoxy triacrylate, and the like.

Exemplary polyfunctional (meth)acrylates include dipentaerythritol polyacrylate, dipentaerythritol hexaacrylate, pentaerythritol tetraacrylate, pentaerythritolethoxy tetraacrylate, ditrimethylolpropane tetraacrylate, and the like.

Additional exemplary acrylates contemplated for use in the practice of the present invention include those described in U.S. Pat. No. 5,717,034, the entire contents of which are hereby incorporated by reference herein.

Maleimides, Nadimides or Itaconimides

Maleimides, nadimides or itaconimides contemplated for use herein are compounds having the structure:

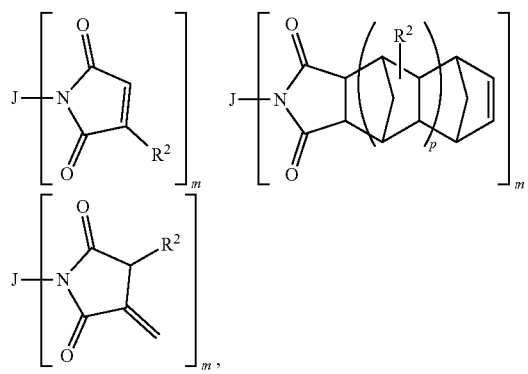

respectively, wherein:
  m is 1-15,
  p is 0-15,
  each $R^2$ is independently selected from hydrogen or lower alkyl (such as $C_{1-5}$), and
  J is a monovalent or a polyvalent radical comprising organic or organosiloxane radicals, and combinations of two or more thereof.

In some embodiments of the present invention, J is a monovalent or polyvalent radical selected from:

hydrocarbyl or substituted hydrocarbyl species typically having in the range of about 6 up to about 500 carbon atoms, where the hydrocarbyl species is selected from alkyl, alkenyl, alkynyl, cycloalkyl, cycloalkenyl, aryl, alkylaryl, arylalkyl, aryalkenyl, alkenylaryl, arylalkynyl or alkynylaryl, provided, however, that X can be aryl only when X comprises a combination of two or more different species;

hydrocarbylene or substituted hydrocarbylene species typically having in the range of about 6 up to about 500 carbon atoms, where the hydrocarbylene species are selected from alkylene, alkenylene, alkynylene, cycloalkylene, cycloalkenylene, arylene, alkylarylene, arylalkylene, arylalkenylene, alkenylarylene, arylalkynylene or alkynylarylene, heterocyclic or substituted heterocyclic species typically having in the range of about 6 up to about 500 carbon atoms, polysiloxane, or polysiloxane-polyurethane block copolymers, as well as combinations of one or more of the above with a linker selected from covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—NR—S(O)$_2$—, —O—P(O)R$_2$—, —S—P(O)R$_2$—, or —NR—P(O)R$_2$—; where each R is independently hydrogen, alkyl or substituted alkyl.

Exemplary compositions include those wherein J is oxyalkyl, thioalkyl, aminoalkyl, carboxyalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene, oxycycloalkenylene, thiocycloalkenylene, aminocycloalkenylene, carboxycycloalkenylene, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, or a carboxyheteroatom-containing di- or polyvalent cyclic moiety.

Cyanate Ester-Based Resins

Cyanate ester monomers contemplated for use in the practice of the present invention contain two or more ring forming cyanate (—O—C≡N) groups which cyclotrimerize to form substituted triazine rings upon heating. Because no leaving groups or volatile byproducts are formed during curing of the cyanate ester monomer, the curing reaction is referred to as addition polymerization. Suitable polycyanate ester monomers that may be used in the practice of the present invention include, for example, 1,1-bis(4-cyanatophenyl)methane, 1,1-bis(4-cyanatophenyl)ethane, 2,2-bis(4-cyanatophenyl)propane, bis(4-cyanatophenyl)-2,2-butane, 1,3-bis[2-(4-cyanato phenyl)propyl]benzene, bis(4-cyanatophenyl)ether, 4,4'-dicyanatodiphenyl, bis(4-cyanato-3,5-dimethylphenyl)methane, tris(4-cyanatophenyl)ethane, cyanated novolak, 1,3-bis[4-cyanatophenyl-1-(1-methylethylidene)]benzene, cyanated phenoldicyclopentadiene adduct, and the like. Polycyanate ester monomers utilized in accordance with the present invention may be readily prepared by reacting appropriate dihydric or polyhydric phenols with a cyanogen halide in the presence of an acid acceptor.

Monomers that can optionally be combined with polycyanate ester monomer(s) in accordance with the present invention are selected from those monomers which undergo addition polymerization. Such monomers include vinyl ethers, divinyl ethers, diallyl ethers, dimethacrylates, dipropargyl ethers, mixed propargyl allyl ethers, monomaleimides, bismaleimides, and the like. Examples of such monomers include cyclohexanedimethanol monovinyl ether, trisallylcyanurate, 1,1-bis(4-allyloxyphenyl)ethane, 1,1-bis(4-propargyloxyphenyl)ethane, 1,1-bis(4-allyloxyphenyl-4'-propargyloxyphenyl)ethane, dimethyltrimethylene acetal)-1-maleimidobenzene, 2,2,4-trimethylhexamethylene-1,6-bismaleimide, 2,2-bis[4-(4-maleimidophenoxy)phenyl]propane, and the like.

Additional cyanate esters contemplated for use in the practice of the present invention are well known in the art. See, for example, U.S. Pat. No. 5,718,941, the entire contents of which are hereby incorporated by reference herein.

Silicones

Silicones contemplated for use in the practice of the present invention are well known in the art. See, for example, U.S. Pat. No. 5,717,034, the entire contents of which are hereby incorporated by reference herein.

Oxetanes

Oxetanes (i.e., 1,3-propylene oxides) are heterocyclic organic compounds with the molecular formula $C_3H_6O$, having a four-membered ring with three carbon atoms and one oxygen atom. The term oxetane also refers generally to any organic compound containing an oxetane ring. See, for example, Burkhard et al., in Angew. Chem. Int. Ed. 2010, 49, 9052-9067, the entire contents of which are hereby incorporated by reference herein.

Polyester-Based Resins

Polyesters contemplated for use in the practice of the present invention refer to condensation polymers formed by the reaction of polyols (also known as polyhydric alcohols), with saturated or unsaturated dibasic acids. Typical polyols used are glycols such as ethylene glycol; acids commonly used are phthalic acid and maleic acid. Water, a by-product of esterification reactions, is continuously removed, driving the reaction to completion. The use of unsaturated polyesters and additives such as styrene lowers the viscosity of the resin. The initially liquid resin is converted to a solid by cross-linking chains. This is done by creating free radicals at unsaturated bonds, which propagate to other unsaturated bonds in adjacent molecules in a chain reaction, linking the adjacent chains in the process.

Polyurethane-Based Resins

Polyurethanes contemplated for use in the practice of the present invention refer to polymers composed of a chain of organic units joined by carbamate (urethane) links. Polyurethane polymers are formed by reacting an isocyanate with a polyol. Both the isocyanates and polyols used to make polyurethanes contain on average two or more functional groups per molecule.

Polyimide-Based Resins

Polyimides contemplated for use in the practice of the present invention refer to polymers composed of a chain of organic units joined by imide linkages (i.e., —C(O)—N(R)—C(O)—). Polyimide polymers can be formed by a variety of reactions, i.e., by reacting a dianhydride and a diamine, by the reaction between a dianhydride and a diisocyanate, and the like.

Melamine-Based Resins

Melamines contemplated for use in the practice of the present invention refer to hard, thermosetting plastic materials made from melamine (i.e., 1,3,5-triazine-2,4,6-triamine) and formaldehyde by polymerization. In its butylated form, it can be dissolved in n-butanol and/or xylene. It can be used to cross-link with other resins such as alkyd, epoxy, acrylic, and polyester resins.

Urea-Formaldehyde-Based Resins

Urea-formaldehydes contemplated for use in the practice of the present invention refers to a non-transparent thermosetting resin or plastic made from urea and formaldehyde heated in the presence of a mild base such as ammonia or pyridine.

Phenol-Formaldehyde-Based Resins

Phenol-formaldehydes contemplated for use in the practice of the present invention refer to synthetic polymers obtained by the reaction of phenol or substituted phenol with formaldehyde.

Exemplary thermoplastic resins contemplated for use herein include polyesters, polyacrylates (e.g., poly(methacrylate), poly(butyl methacrylate), polyurethanes, phenoxies, polyethyloxyazoline, polyvinyl pyrrolidone, polyvinyl alcohol, polyacrylamide, polyglycol, and polyacrylic acid; poly(ethylene glycol), an aromatic vinyl polymer, flexible epoxy, polymer with epoxy functional groups, polycarbonate, ABS, PC/ABS alloys, nylon, inherently conductive polymer, silicone polymer, siloxane polymer, rubbers, polyolefins, vinyls polymer, polyamides, fluoropolymers, polyphenylene ethers, co-polyestercarbonates, acrylonitrile butadiene styrene copolymers, polyarylate ether sulfones or ketones, polyamide imides, polyetherimides, poly(ethylene terephthalate), poly(1,4-butylene terephthalate), polyethylenes, polypropylenes, polypropylene-EPDM blends, butadienes, styrene-butadienes, nitriles, chlorosulfonates, neoprenes, acrylonitrile butadiene styrene copolymers, polyetheresters, styrene/acrylonitrile polymer, polyphenylene sulfide, nitrile rubbers, cellulose resin, and the like, as well as mixtures of any two or more thereof.

Optional Additives

In accordance with some embodiments of the present invention, the compositions described herein may further comprise one or more flow additives, adhesion promoters, rheology modifiers, toughening agents, fluxing agents, film flexibilizers, phenol-novolac hardeners, epoxy-curing catalysts (e.g., imidazole), curing agents (e.g., dicumyl peroxide), and the like, as well as mixtures of any two or more thereof.

As used herein, the term "flow additives" refers to compounds which modify the viscosity of the formulation to which they are introduced. Exemplary compounds which impart such properties include silicon polymers, ethyl acrylate/2-ethylhexyl acrylate copolymers, alkylol ammonium salts of phosphoric acid esters of ketoxime, and the like, as well as combinations of any two or more thereof.

As used herein, the term "adhesion promoters" refers to compounds which enhance the adhesive properties of the formulation to which they are introduced.

As used herein, the term "rheology modifiers" refers to additives which modify one or more physical properties of the formulation to which they are introduced.

As used herein, the term "toughening agents" refers to additives which enhance the impact resistance of the formulation to which they are introduced.

As used herein, the term "fluxing agents" refers to reducing agents which prevent oxides from forming on the surface of the molten metal.

As used herein, the term "film flexibilizers" refers to agents which impart flexibility to the films prepared from formulations containing same.

As used herein, the term "phenol-novolac hardeners" refers to materials which participate in the further interaction of reactive groups so as to increase the cross-linking thereof—thereby enhancing the stiffness thereof.

As used herein, the term "epoxy-curing catalysts" refers to reactive agents which promote oligomerization and/or polymerization of epoxy-containing moieties, e.g., imidazole.

As used herein, the term "curing agents" refers to reactive agents such as dicumyl peroxide which promote the curing of monomeric, oligomeric or polymeric materials.

Fillers

Conductive fillers contemplated for use herein include gold, silver, copper, platinum, palladium, nickel, aluminum, indium, alloy of nickel (e.g., alloy 42), alloy of zinc, alloy of iron, alloy of indium, silver-plated copper, silver-plated aluminum, bismuth, tin, bismuth-tin alloy, silver-plated fiber, silver-plated graphite, silver-plated silicon carbide, silver-plated boron nitride, silver-plated diamond, silver-plated alumina, silver-plated alloy 42, graphene, silver-plated graphene, silver-coated polymer, cadmium and alloys of cadmium, lead and alloys of lead, antimony and alloys of antimony, and the like, as well as mixtures of any two or more thereof. Said particulate, conductive filler typically has a particle size in the range of about 1 nm up to about 50 µm; in some embodiments, the conductive filler has a particle size in the range of about 10 nanometer up to about 20 micrometers.

In accordance with the present invention, the particulate, conductive filler employed herein can be substantially nanoparticulate, or the particulate, conductive filler employed herein can be substantially larger, non-nanoparticulate, or the particulate, conductive filler employed herein can be a combination of nanoparticulate and non-nanoparticulate.

For example, in some embodiments of the present invention, up to 100 wt % of the particulate, conductive filler employed herein has a particle size in the range of about 2-1000 nanometers, and an average particle size in the range of about 2-1000 nm, and the remaining particulate, conductive filler has a particle size no greater than 50 microns.

In some embodiments of the present invention, up to 100 wt % of the particulate, conductive filler employed herein has a particle size no greater than 50 microns, and an average particle size in the range of about 1-25 µm.

In some embodiments of the present invention, up to 10 wt % of the particulate, conductive filler employed herein has a particle size in the range of about 2-1000 nanometers; in some embodiments, up to 20 wt % of the particulate, conductive filler employed in the practice of the present invention has a particle size in the range of about 2-1000 nanometers; in some embodiments, up to 30 wt % of the particulate, conductive filler employed in the practice of the present invention has a particle size in the range of about 2-1000 nanometers; in some embodiments, up to 40 wt % of the particulate, conductive filler employed in the practice of the present invention has a particle size in the range of about 2-1000 nanometers; in some embodiments, up to 50 wt % of the particulate, conductive filler employed in the practice of the present invention has a particle size in the range of about 2-1000 nanometers; in some embodiments, up to 60 wt % of the particulate, conductive filler employed in the practice of the present invention has a particle size in the range of about 2-1000 nanometers; in some embodiments, up to 70 wt % of the particulate, conductive filler employed in the practice of the present invention has a particle size in the range of about 2-1000 nanometers; in some embodiments, up to 80 wt % of the particulate, conductive filler employed in the practice of the present invention has a particle size in the range of about 2-1000 nanometers; in some embodiments, up to 90 wt % of the particulate, conductive filler employed in the practice of the present invention has a particle size in the range of about 2-1000 nanometers.

In some embodiments, up to 10 wt % of the particulate, conductive filler employed in the practice of the present invention has a particle size in the range of about 2-500 nanometers; in some embodiments, up to 20 wt % of the particulate, conductive filler employed in the practice of the present invention has a particle size in the range of about 2-500 nanometers; in some embodiments, up to 30 wt % of the particulate, conductive filler employed in the practice of the present invention has a particle size in the range of about 2-500 nanometers; in some embodiments, up to 40 wt % of the particulate, conductive filler employed in the practice of the present invention has a particle size in the range of about 2-500 nanometers; in some embodiments, up to 50 wt % of the particulate, conductive filler employed in the practice of the present invention has a particle size in the range of about 2-500 nanometers; in some embodiments, up to 60 wt % of the particulate, conductive filler employed in the practice of the present invention has a particle size in the range of about 2-500 nanometers; in some embodiments, up to 70 wt % of the particulate, conductive filler employed in the practice of the present invention has a particle size in the range of about 2-500 nanometers; in some embodiments, up to 80 wt % of the particulate, conductive filler employed in the practice of the present invention has a particle size in the range of about 2-500 nanometers; in some embodiments, up to 90 wt % of the particulate, conductive filler employed in the practice of the present invention has a particle size in the range of about 2-500 nanometers.

In some embodiments, up to 10 wt % of the particulate, conductive filler employed in the practice of the present invention has a particle size no greater than 50 microns, and an average particle size in the range of about 1-25 µm; in some embodiments, up to 20 wt % of the particulate, conductive filler employed in the practice of the present invention has a particle size no greater than 50 microns, and an average particle size in the range of about 1-25 µm; in some embodiments, up to 30 wt % of the particulate, conductive filler employed in the practice of the present invention has a particle size no greater than 50 microns, and an average particle size in the range of about 1-25 µm; in some embodiments, up to 40 wt % of the particulate, conductive filler employed in the practice of the present invention has a particle size no greater than 50 microns, and an average particle size in the range of about 1-25 µm; in some embodiments, up to 50 wt % of the particulate, conductive filler employed in the practice of the present invention has a particle size no greater than 50 microns, and an average particle size in the range of about 1-25 µm; in some embodiments, up to 60 wt % of the particulate, conductive filler employed in the practice of the present invention has a particle size no greater than 50 microns, and an average particle size in the range of about 1-25 µm; in some embodiments, up to 70 wt % of the particulate, conductive filler employed in the practice of the present invention has a particle size no greater than 50 microns, and an average particle size in the range of about 1-25 µm; in some embodiments, up to 80 wt % of the particulate, conductive filler employed in the practice of the present invention has a particle size no greater than 50 microns, and an average particle size in the range of about 1-25 µm; in some embodiments, up to 90 wt % of the particulate, conductive filler employed in the practice of the present invention has a particle size no greater than 50 microns, and an average particle size in the range of about 1-25 µm.

In some embodiments, up to 10 wt % of the particulate, conductive filler employed in the practice of the present invention has a particle size no greater than 50 microns, and an average particle size in the range of about 10 nanometers-10 µm; in some embodiments, up to 20 wt % of the particulate, conductive filler employed in the practice of the present invention has a particle size no greater than 50 microns, and an average particle size in the range of about 10 nanometers-10 µm; in some embodiments, up to 30 wt % of the particulate, conductive filler employed in the practice of the present invention has a particle size no greater than 50 microns, and an average particle size in the range of about 10 nanometers-10 µm; in some embodiments, up to 40 wt % of the particulate, conductive filler employed in the practice of the present invention has a particle size no greater than 50 microns, and an average particle size in the range of about 10 nanometers-10 µm; in some embodiments, up to 50 wt % of the particulate, conductive filler employed in the practice of the present invention has a particle size no greater than 50 microns, and an average particle size in the range of about 10 nanometers-10 µm; in some embodiments, up to 60 wt % of the particulate, conductive filler employed in the practice of the present invention has a particle size no greater than 50 microns, and an average particle size in the range of about 10 nanometers-10 µm; in some embodiments, up to 70 wt % of the particulate, conductive filler employed in the practice of the present invention has a particle size no greater than 50 microns, and an average particle size in the range of about 10 nanometers-10 µm; in some embodiments, up to 80 wt % of the particulate, conductive filler employed in the practice of the present invention has a particle size no greater than 50 microns, and an average particle size in the range of about 10 nanometers-10 µm; in some embodiments, up to 90 wt % of the particulate, conductive filler employed in the practice of the present invention has a particle size no greater than 50 microns, and an average particle size in the range of about 10 nanometers-10 µm.

In accordance with yet another aspect of the present invention, there are provided conductive formulations comprising:
  a conductive filler, and
  a diluent;
wherein said conductive formulation has:
  a viscosity in the range of about 1 up to about 20,000 centipoise at the operating temperature,
  a thixotropic index (TI) in the range of about 0.01 up to about 5 at the operating temperature, and
  a volume resistance and/or magnetic resistance effective for electromagnetic interference (EMI) shielding.

When invention formulations comprise a conductive filler and diluent only, the formulation typically comprises:
  in the range of about 10 wt % up to about 95 wt % of said conductive filler, based on the total weight of said formulation, and
  in the range of about 5 up to about 90 wt % of said diluent, based on the total weight of said formulation.

Diluent

While not required for the practice of certain embodiments of the present invention, non-reactive organic diluent may optionally be employed, e.g., to facilitate handling of invention formulations as a result, for example, of lower viscosity, improved dispensibility, and the like; when employed, it is preferable that the boiling point of the diluent should be close to the filler sintering temperature so that as diluent evaporates, particles touch each other and sinter.

When present, exemplary organic diluents are selected from the group consisting of aromatic hydrocarbons (e.g., benzene, toluene, xylene, and the like), saturated hydrocarbons (e.g., hexane, cyclohexane, heptane, tetradecane), chlorinated hydrocarbons (e.g., methylene chloride, chloroform, carbon tetrachloride, dichloroethane, trichloroethylene, and the like), ethers (e.g., diethyl ether, tetrahydrofuran, dioxane, glycol ethers, monoalkyl or dialkyl ethers of ethylene glycol, and the like), polyols (e.g., polyethylene glycol, propylene glycol, polypropylene glycol, and the like), esters (e.g., ethyl acetate, butyl acetate, methoxy propyl acetate, and the like); dibasic esters (e.g., DBE-9), alpha-terpineol, beta-terpineol, kerosene, dibutylphthalate, butyl carbitol, butyl carbitol acetate, carbitol acetate, ethyl carbitol acetate, hexylene glycol, high boiling alcohols and esters thereof, glycol ethers, ketones (e.g., acetone, methyl ethyl ketone, and the like), amides (e.g., dimethylformamide, dimethylacetamide, and the like), heteroaromatic compounds (e.g., N-methylpyrrolidone, and the like), and the like, as well as mixtures of any two or more thereof.

In some embodiments, the diluent employed is butyl acetate, diethylene glycol monoethyl ether acetate (carbitol acetate), dipropylene glycol methyl ether, MEK, acetone, or DBE-9.

Articles/Assemblies

In accordance with another aspect of the present invention, there are provided articles/assemblies comprising a suitable substrate having one or more gaps therein, wherein said gap(s) are filled with an invention formulation as described herein. Suitable substrate materials include EMCs (epoxy molded compounds), laminate substrates, polyethylene terephthalates, polymethyl methacrylates, polyolefins (e.g., polyethylenes, polypropylenes, and the like), polycarbonates, epoxy resins, polyimides, polyamides, polyesters, glass, and the like.

Suitable substrate structures include dies (e.g., Si die with silicon nitride passivation, Si die with polyimide passivation, BT substrates, bare Si, and the like), stacked die, wafers, flip chip packages, hybrid memory cubes, TSV devices, SR4 substrates, SR5 substrates, and the like.

Invention formulations applied in accordance with the present invention display good adhesion to the substrate to which it is applied.

As readily recognized by those of skill in the art, adhesion between invention formulations and a substrate therefor can be determined in a variety of ways, e.g., by ASTM standard cross-cut tape test pursuant to test method D 3359-97. Typically, the adhesion between the formulation and the substrate is at least level 1B, as determined by ASTM standard cross-cut tape test pursuant to test method D 3359-97. In some embodiments, adhesion comparable to at least ASTM level 1B is observed (i.e., at least 35% of the originally adhered film surface remains attached to the substrate after being subjected to the tape test). In certain embodiments of the present invention, adhesion comparable to at least ASTM level 2B is observed (i.e., at least 65% of the originally adhered formulation remains attached to the substrate after being subjected to the tape test). In certain embodiments of the present invention, adhesion comparable to at least ASTM level 3B is observed (i.e., at least 85% of the originally adhered formulation remains attached to the substrate after being subjected to the tape test). In certain embodiments of the present invention, adhesion comparable to at least ASTM level 4B is observed (i.e., at least 95% of the originally adhered formulation remains attached to the substrate after being subjected to the tape test). In certain embodiments of the present invention, adhesion comparable to at least ASTM level 5B is observed (i.e., 100% of the originally adhered formulation remains attached to the substrate after being subjected to the tape test).

In accordance with still another aspect of the present invention, there are provided articles comprising a substrate having a substantially uniform coating of invention compositions on all exposed surfaces thereof.

In some aspects, substrate is substantially uniformly coated with an invention composition on the top and any side walls of invention articles. In some aspects, the composition is dried, cured and/or sintered after application to a suitable substrate.

In accordance with additional embodiments of the present invention, there are provided methods to fill a gap in an electronic package to achieve electromagnetic interference (EMI) shielding thereof, said methods comprising:
  dispensing a conductive formulation according to any of the embodiments set forth herein at the open edge or along the gap under conditions suitable for capillary flow of said formulation, and
  subjecting said package to conditions suitable for capillary flow,
  optionally subjecting said formulation to conditions suitable to cure thermoset components thereof, and optionally removing any residual diluent therefrom.

Dispensing contemplated herein includes such methods as jetting, electrostatic spray, needle dispense, air spray, and the like.

Conditions suitable for capillary flow contemplated herein comprise subjecting said gap to reduced pressure, subjecting said gap to elevated pressure, exposing said article to a vacuum oven, exposing said article to a pressure oven, and the like.

Conditions suitable to cure thermoset components of invention formulations include oven cure, snap cure, uv cure, microwave cure, e-beam cure, and the like.

Optionally, prior to filling a gap in an electronic package according to the present invention (i.e., prior to dispensing said conductive formulation thereon), said package may optionally be subjected to surface treatment of said gap (e.g., by plasma cleaning, solvent (e.g., water) wash, corona treatment, primer treatment, and the like.

Additional further steps contemplated for optional inclusion herein include applying an encapsulant to said electronic package and/or applying a conformal coating on all or a portion of the package.

Gaps contemplated for filling employing invention formulations and methods are typically less than about 250 μm; in some embodiments, gaps contemplated for filling employing invention formulations and methods are typically less than about 200 μm; in some embodiments, gaps contemplated for filling employing invention formulations and methods are typically less than about 150 μm; in some embodiments, gaps contemplated for filling employing invention formulations and methods are typically less than about 120 μm; in some embodiments, gaps contemplated for filling employing invention formulations and methods are typically less than about 100 μm; in some embodiments, gaps contemplated for filling employing invention formulations and methods are typically less than about 80 μm; in some embodiments, gaps contemplated for filling employing invention formulations and methods are typically less than about 60 μm; in some embodiments, gaps contemplated for filling employing invention formulations and methods are typically less than about 40 μm.

In accordance with yet another embodiment of the present invention, there are provided methods for imparting electromagnetic interference shielding (EMI) protection to an electronic component, said methods comprising:

applying a composition according to the present invention to said electronic component by electrostatic spray processing, and drying, curing and/or sintering the composition.

In accordance with still another embodiment of the present invention, there are provided methods for preparing a conductive network, said method comprising:

applying a composition according to the present invention to a suitable substrate by electrostatic spray processing in a predefined pattern, and thereafter drying, curing and/or sintering said composition.

In accordance with a further embodiment of the present invention, there are provided conductive networks prepared by the above-described method.

Conductive networks contemplated herein typically have a volume resistivity of no greater than about $1\times10^{-3}$ Ohms·cm.

Various aspects of the present invention are illustrated by the following non-limiting examples. The examples are for illustrative purposes and are not a limitation on any practice of the present invention. It will be understood that variations and modifications can be made without departing from the spirit and scope of the invention. One of ordinary skill in the art readily knows how to synthesize or commercially obtain the reagents and components described herein.

Example 1

The following exemplary formulation is prepared by combining the following components:

Sample 1

| | |
|---|---|
| Celloxide 2021P (epoxy) | 5.71 |
| Epiclon EXA 830 CRP (epoxy) | 1.90 |
| Ricon 130 MA 20 (rubber) | 4.35 |
| Silane A 186 (silane) | 0.27 |
| Sartomer SR 285 (diluent) | 5.00 |
| Imicure HAPI (solid) (Curing agent) | 0.76 |
| FA-FAB-238 | 82.00 |
| Subtotal (g) | 100.00 |

The filler (FA-FAB-238) is characterized as follows:

| | | FA-FAB-238 |
|---|---|---|
| Particle size | Dmax | 9.3 |
| | D90 | 3.7 |
| | D50 | 2.1 |
| | D10 | 0.9 |
| | Specific surface area | 0.9 m^2/g |
| | Tap density | 5.1 g/cm^3 |

Figure 1B:
Figure 1C:
Figure 2A:
FIGS. 2A-2C illustrate another embodiment of the present invention wherein a conductive formulation according to the present invention is applied in the middle of the gap of an article having a gap therein under conditions suitable for capillary flow of said formulation so as to substantially fill the gap.
Figure 2B:
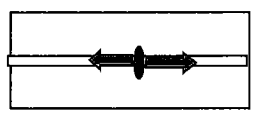
Figure 2C:

The resulting formulation flows smoothly into the gap when applied to a substrate having a gap therein (see, for example, FIGS. 1A-1C and 2A-2C).

Example 2

Another exemplary formulation is prepared by combining the following components:

Sample 2

| | |
|---|---|
| Celloxide 2021P (epoxy) | 5.71 |
| Epiclon EXA 830 CRP (epoxy) | 1.90 |
| Ricon 130 MA 20 (rubber) | 4.35 |
| Silane A 186 (silane) | 0.27 |
| Sartomer SR 285 (diluent) | 5.00 |
| Imicure HAPI (solid) (Curing agent) | 0.76 |
| AgCu 0204 | 82.00 |
| Subtotal (g) | 100.00 |

The filler (AgCu-0204) is characterized as follows:

| | | AgCu 0204 |
|---|---|---|
| Particle size | Dmax | 9.3 |
| | D90 | 5.05 |
| | D50 | 3.04 |
| | D10 | 1.88 |
| | Specific surface area | 0.38 m^2/g |
| | Tap density | 4.6 g/cm^3 |

The resulting formulation flows smoothly into the gap when applied to a substrate having a gap therein (see, for example, FIGS. 1A-1C and 2A-2C).

Example 3

Another exemplary formulation is prepared by combining the following components:

Sample 3

| | |
|---|---|
| Nano silver with 90 nm diameter (85 wt % in diethylene glycol mono-n-butyl ether) | 95 |
| Butyl acetate | 5 |
| Total | 100 |

The resulting formulation flows smoothly into the gap when applied to a substrate having a gap therein (see, for example, FIGS. 1A-1C and 2A-2C).

Various modifications of the present invention, in addition to those shown and described herein, will be apparent to those skilled in the art of the above description. Such modifications are also intended to fall within the scope of the appended claims.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

That which is claimed is:

1. A conductive formulation comprising:
   an organic matrix comprising a thermoset resin and curing agent therefor, and/or a thermoplastic resin and optional curing agent therefor, wherein the organic matrix includes a maleinized polybutadiene,
   a conductive filler, and
   optionally a diluent;
   wherein said conductive formulation has:
   a viscosity in the range of about 1 up to about 20,000 centipoise at ambient temperature,
   a thixotropic index (TI) in the range of about 0.01 up to about 5 at ambient temperature, and
   a volume resistance and/or magnetic resistance effective for electromagnetic interference (EMI) shielding.

2. The formulation of claim 1 wherein said formulation has an electrical volume resistivity in the range of about $10^{-6}$ up to about $10^3$ ohm-cm.

3. The formulation of claim 2 further characterized as having an EMI shielding effectiveness of 1-200 dB.

4. The formulation of claim 1 wherein said formulation has an EMI shielding effectiveness of 1-200 dB.

5. The formulation of claim 1 further comprising one or more of flow additives, adhesion promoters, rheology modifiers, toughening agents, fluxing agents, film flexibilizers, phenol-novolac hardeners, epoxy-curing catalysts (e.g., imidazole), curing agents (e.g., dicumyl peroxide), conductivity promoter, coloring agents (e.g., pigments), stabilizers (e.g., anti-oxidant), and/or cure accelerator, as well as mixtures of any two or more thereof.

6. The formulation of claim 1 wherein:
   said thermoset resin comprises in the range of about 0.1 wt % up to about 90 wt % of said formulation,
   said conductive filler comprises in the range of about 10 wt % up to about 95 wt % of said formulation,
   said curing agent comprises in the range of about 0.01 wt % up to about 1 wt % of said formulation, and
   said optional diluent comprises in the range of 0 up to about 89.8 wt % of said formulation.

7. The formulation of claim 1 wherein the curing agent for said thermoset is a urea, an aliphatic amine, an aromatic amine, an amine hardener, a polyamide, an imidazole, a dicyandiamide, an hydrazide, an urea-amine hybrid curing system, a free radical initiator (e.g., a peroxy ester, a peroxy carbonate, an hydroperoxide, an alkylperoxide, an arylperoxide, an azo compound, and the like), an organic base, a transition metal catalyst, a phenol, an acid anhydride, a Lewis acid, a Lewis base, or mixtures of any two or more thereof.

8. The formulation of claim 1 wherein:
   said thermoplastic resin comprises in the range of about 0.5 wt % up to about 90 wt % of said formulation,
   said conductive filler comprises in the range of about 10 wt % up to about 95 wt % of said formulation, and
   said optional diluent comprises in the range of 0 up to about 89.5 wt % of said formulation.

9. The formulation of claim 7 wherein said thermoplastic includes a polyester, a polyacrylate (e.g., poly(methacrylate), a poly(butyl methacrylate), a polyurethane, a phenoxy, a polyethyloxyazoline, a polyvinyl pyrrolidone, a polyvinyl alcohol, a polyacrylamide, a polyglycol, a polyacrylic acid; a poly(ethylene glycol), an aromatic vinyl polymer, a flexible epoxy, a polymer with epoxy functional groups, a poly carbonate, an ABS, a PC/ABS alloy, nylon, an inherently conductive polymer, a silicone polymer, a siloxane polymer, a rubber, a polyolefin, a vinyl polymer, a polyamide, a fluoropolymer, a polyphenylene ether, a co-polyestercarbonate, an acrylonitrile butadiene styrene copolymer, a polyarylate ether sulfone or ketone, a polyamide imide, a polyetherimide, a poly(ethylene terephthalate), a poly(1,4-butylene terephthalate), a polyethylene, a polypropylene, a polypropylene-EPDM blend, a polybutadiene, a styrene-butadiene, a nitrile, a chlorosulfonate, a neoprene, an acrylonitrile butadiene styrene copolymer, a polyetherester, a styrene/acrylonitrile polymer, a polyphenylene sulfide, a nitrile rubber, a cellulose resin, or mixtures of any two or more thereof.

10. The formulation of claim 1 wherein said conductive filler is gold, silver, copper, platinum, palladium, nickel, aluminum, indium, alloy of nickel (e.g., alloy 42), alloy of zinc, alloy of iron, alloy of indium, silver-plated copper, silver-plated aluminum, bismuth, tin, bismuth-tin alloy, silver-plated fiber, silver-plated graphite, silver-plated silicon carbide, silver-plated boron nitride, silver-plated diamond, silver-plated alumina, silver-plated alloy 42, graphene, silver-plated graphene, cadmium and alloys of cadmium, lead and alloys of lead, antimony and alloys of antimony, or mixtures of any two or more thereof.

11. The formulation of claim 10 wherein said conductive filler has a particle size in the range of about 1 nanometer up to about 50 micrometers.

12. The formulation of claim 1 wherein said diluent is an aromatic hydrocarbon, a saturated hydrocarbon, a chlorinated hydrocarbon, an ether, a polyol, an ester, a dibasic ester, an alpha-terpineol, a beta-terpineol, kerosene, a dibutylphthalate, a butyl carbitol, a butyl carbitol acetate, a carbitol acetate, an ethyl carbitol acetate, a hexylene glycol, a high boiling alcohol and esters thereof, a glycol ether, a ketone, an amide, an heteroaromatic compound, or mixtures of any two or more thereof.

13. A method to fill a gap in an electronic package to achieve electromagnetic interference (EMI) shielding thereof, said method comprising:
  dispensing a conductive formulation according to any of the preceding claims at the open edge or along the gap under conditions suitable for capillary flow of said formulation, and
  subjecting said package to conditions suitable for capillary flow,
  optionally subjecting said formulation to conditions suitable to cure thermoset components thereof, and
  optionally removing any residual diluent therefrom.

14. The method of claim 13 further comprising surface treatment of said gap prior to dispensing said conductive formulation thereon.

15. The method of claim 13 further comprising applying an encapsulant to said electronic package.

16. The method of claim 13 further comprising applying a conformal coating on all or a portion of the package.

17. The method of claim 13 wherein the gap in said electronic package is less than 250 µm.

18. The method of claim 13 wherein conditions suitable for capillary flow comprise subjecting said gap to reduced pressure, subjecting said gap to elevated pressure, exposing said article to a vacuum oven, or exposing said article to a pressure oven.

19. The shielded article produced by the method of claim 13.

20. A shielded article comprising an electronic package with a gap defined between gap walls, wherein the gap is filled with the formulation according to claim 1, and wherein the formulation has a surface tension that is less than a surface energy of the gap walls.

* * * * *